(12) United States Patent
Wan

(10) Patent No.: US 12,171,094 B2
(45) Date of Patent: Dec. 17, 2024

(54) SEMICONDUCTOR STRUCTURE, FORMATION METHOD THEREOF AND MEMORY

(71) Applicant: CHANGXIN MEMORY TECHNOLOGIES, INC., Hefei (CN)

(72) Inventor: Wei Wan, Hefei (CN)

(73) Assignee: CHANGXIN MEMORY TECHNOLOGIES, INC., Hefei (CN)

( * ) Notice: Subject to any disclaimer, the term of this patent is extended or adjusted under 35 U.S.C. 154(b) by 540 days.

(21) Appl. No.: 17/486,696

(22) Filed: Sep. 27, 2021

(65) Prior Publication Data

US 2023/0005929 A1 Jan. 5, 2023

Related U.S. Application Data

(63) Continuation of application No. PCT/CN2021/106500, filed on Jul. 15, 2021.

(30) Foreign Application Priority Data

Jul. 2, 2021 (CN) .......................... 202110750964.8

(51) Int. Cl.
H10B 12/00 (2023.01)
(52) U.S. Cl.
CPC ........... *H10B 12/34* (2023.02); *H10B 12/053* (2023.02)
(58) Field of Classification Search
None
See application file for complete search history.

(56) References Cited

U.S. PATENT DOCUMENTS

| 2008/0087948 A1 | 4/2008 | Kim |
| 2008/0128800 A1 | 6/2008 | Song |
| 2020/0203427 A1* | 6/2020 | Noh ....................... H10B 63/84 |

FOREIGN PATENT DOCUMENTS

| CN | 101009279 A | 8/2007 |
| CN | 102738222 A | 10/2012 |
| CN | 102738222 B | 2/2015 |
| CN | 108717947 A | 10/2018 |
| KR | 20060026262 A | 3/2006 |
| KR | 20060042460 A | 5/2006 |
| KR | 100724572 B1 | 6/2007 |
| KR | 20080010664 A | 1/2008 |
| KR | 100909763 B1 | 7/2009 |

OTHER PUBLICATIONS

Second Office Action of the Chinese application No. 202110750964.8, issued on Nov. 9, 2023. 19 pages with English translation.
International Search Report cited in PCT/CN2021/106500, mailed Mar. 28, 2022, 9 pages.

* cited by examiner

*Primary Examiner* — Hsien Ming Lee
(74) *Attorney, Agent, or Firm* — Kilpatrick Townsend & Stockton LLP

(57) ABSTRACT

Embodiments of the present application disclose a semiconductor structure, a formation method thereof and a memory. The semiconductor structure includes: a substrate; a channel located in the substrate, the channel being configured to form a gate structure; and a convex portion arranged on an inner wall of the channel. The embodiments of the present application can increase a channel length and solve a short-channel effect.

16 Claims, 13 Drawing Sheets

SEMICONDUCTOR STRUCTURE, FORMATION METHOD THEREOF AND MEMORY

CROSS-REFERENCE TO RELATED APPLICATIONS

This application is a continuation application of International Patent Application No. PCT/CN2021/106500, filed on Jul. 15, 2021, which claims priority to Chinese Patent Application No. 202110750964.8, filed with the Chinese Patent Office on Jul. 2, 2021 and entitled "SEMICONDUCTOR STRUCTURE, FORMATION METHOD THEREOF AND MEMORY." International Patent Application No. PCT/CN2021/106500 and Chinese Patent Application No. 202110750964.8 are incorporated herein by reference in their entireties.

TECHNICAL FIELD

The present application relates to the field of semiconductor technologies, and in particular, to a semiconductor structure, a formation method thereof and a memory.

BACKGROUND

The background described in the present application belongs to technologies related to the present application, and is intended to only illustrate and facilitate the understanding of the application content of the present application. The background should not be understood as the prior art relative to a filing date of the present application when the present application is filed for the first time, which is definitely confirmed by the applicant or is inferred to be confirmed by the applicant.

A Dynamic Random Access Memory (DRAM) is a semiconductor memory widely used in mobile phones, computers, automobiles and other electronic products. The difficulty of a DRAM process is related to a size. The smaller the size, the greater the difficulty. In the future, a DRAM process technology may be around 10 nm to 15 nm, which is very strict on the electrical performance of products. A buried gate is used in an active region of the DRAM. The buried gate is generally small in size. The smaller the size is, the easier a short-channel effect may appear.

When a length of a conductive channel of a metal oxide semiconductor field effect transistor is reduced to a dozen of nanometers or even several nanometers, a threshold voltage of a transistor may decrease. This is because when the length of the channel decreases to some extent, a proportion of a depletion region of source and drain junctions in the whole channel increases, and an amount of charges required to form an inversion layer on a silicon surface under the gate decreases, so the threshold voltage decreases.

SUMMARY

Embodiments of the present application provide a semiconductor structure, a formation method thereof and a memory, which can increase a channel length and solve a short-channel effect.

In a first aspect, the embodiments of the present application provide a semiconductor structure, including:
a substrate;
a channel located in the substrate, the channel being configured to form a gate structure; and
a convex portion arranged on an inner wall of the channel.

In a second aspect, the embodiments of the present application provide a semiconductor structure formation method, including:
providing a substrate;
forming a channel on the substrate; and
forming a convex portion on an inner wall of the channel.

In a third aspect, the embodiments of the present application provide a memory, including the semiconductor structure described in any one of the above embodiments.

BRIEF DESCRIPTION OF DRAWINGS

In order to more clearly illustrate the technical solutions in the embodiments of the present application or the prior art, the accompanying drawings used in the description of the embodiments or the prior art will be briefly introduced below. It is apparent that, the accompanying drawings in the following description are only some embodiments of the present application, and other drawings can be obtained by those of ordinary skill in the art from the provided drawings without creative efforts.

DESCRIPTION OF EMBODIMENTS

To enable those skilled in the art to better understand the solutions of the present application, the technical solutions in the embodiments of the present application are clearly and completely described below. It is apparent that the described embodiments are only some, not all, of the embodiments of the present application. All other embodiments obtained by those of ordinary skill in the art based on the embodiments of the present application without creative efforts shall fall within the protection scope of the present application.

In the specification, the claims and the accompanying drawings of the present application, terms such as "first" and "second" are intended to distinguish different objects, but are not intended to describe a specific sequence. Furthermore, terms such as "include/comprise", "have" and other variants thereof are intended to cover a non-exclusive inclusion. For example, processes, methods, systems, products or devices including a series of steps or units are not limited to these steps or units listed, but optionally further include other steps or units not listed, or optionally further include other steps or units inherent to these processes, methods, products or devices.

The "embodiments" mentioned herein means that particular features, structures or characteristics described with reference to the embodiments may be included in at least one embodiment of the present application. Phrases appearing at various positions of the specification neither always refer to the same embodiment, nor separate or alternative embodiments that are mutually exclusive with other embodiments. It is explicitly and implicitly understood by those skilled in the art that the embodiments described herein may be combined with other embodiments.

As shown in FIG. 1 to FIG. 6, an embodiment of the present application provides a semiconductor structure, including:

a substrate 100;
a channel 105 located in the substrate 100, the channel 105 being configured to form a gate structure; and
a convex portion arranged on an inner wall of the channel 105.

An embodiment of the present application provides a semiconductor structure. The semiconductor structure includes a substrate; a channel inside the substrate, the channel being configured to form a buried gate structure; and a convex portion formed on an inner wall of the channel. Under a condition that a depth of the channel is constant, the convex portion can increase a length of the channel, which meets a development direction of a small size, and meanwhile solve the short-channel effect, so as to solve the problem of reduction of the threshold voltage caused by the short-channel effect, and further improve the stability and electrical performance of a device.

Figure 1:
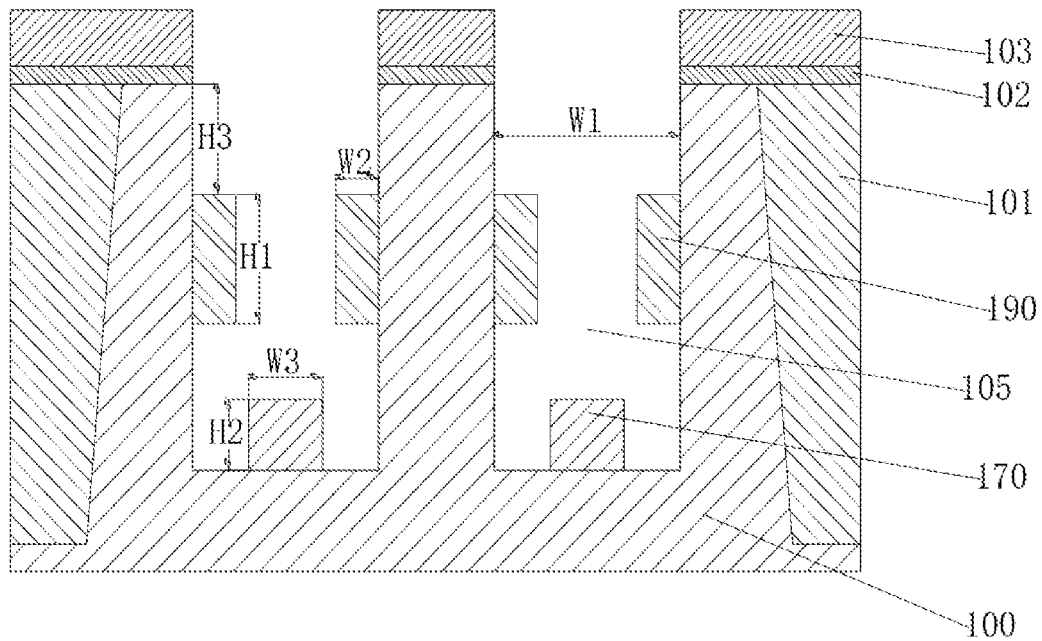
FIG. 1 to FIG. 6 are schematic diagrams of cross-sectional structures of different embodiments of a semiconductor structure according to an embodiment of the present application respectively.

Specifically, referring to FIG. 1, the substrate 100 may be, but is not limited to, a silicon substrate. For example, the substrate 100 is made of any one or more mixtures of a silicon crystal, a germanium crystal, a silicon on insulator structure, a silicon on epitaxial layer structure, a compound semiconductor, and an alloy semiconductor. The compound semiconductor is any one or more mixtures of silicon carbide, gallium arsenide, gallium phosphide, indium phosphide, indium arsenide, and indium dysprosium. The alloy semiconductor is any one or more mixtures of SiGe, GaAsP, AlInAs, AlGaAs, GaInAs, GaInP, and GaInAsP. A description is provided in this specific implementation with an example in which the substrate 100 is a silicon substrate.

The substrate 100 further includes an isolation region 101. An oxide layer 102 and a SIN layer 103 are provided on a surface of the substrate 100.

Figure 2:
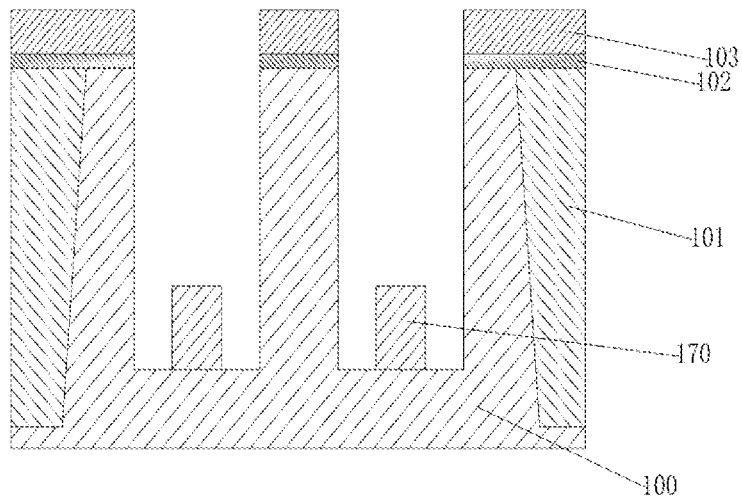
Figure 3:
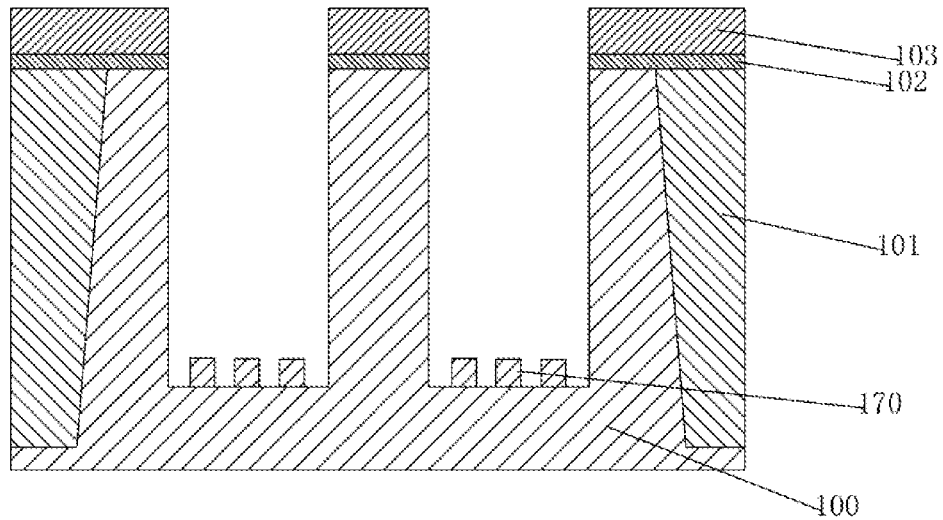
Figure 4:
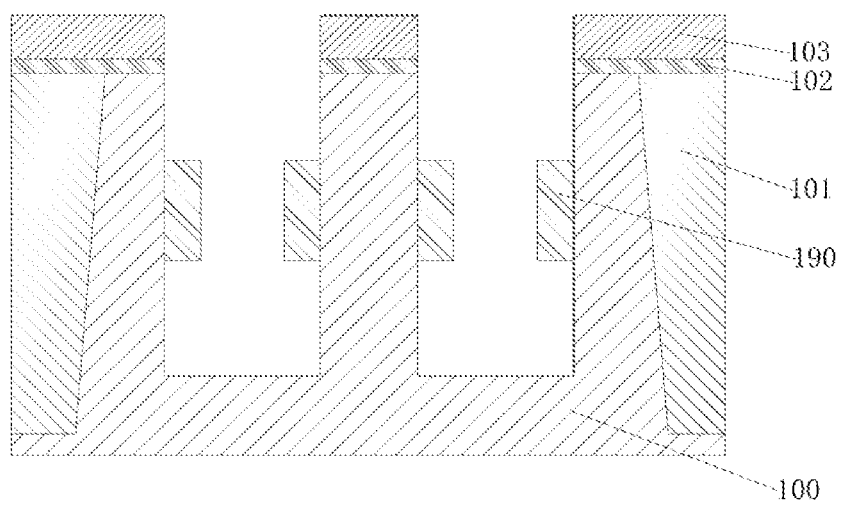
Figure 5:
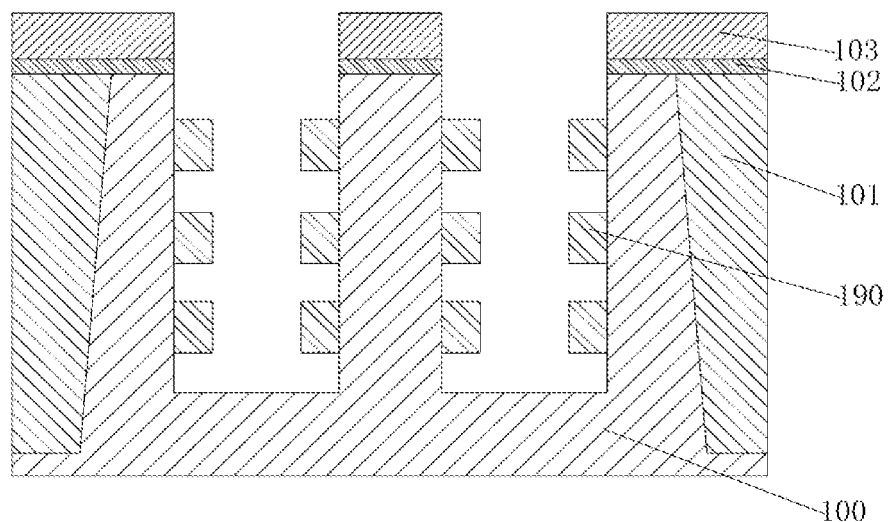
Figure 6:
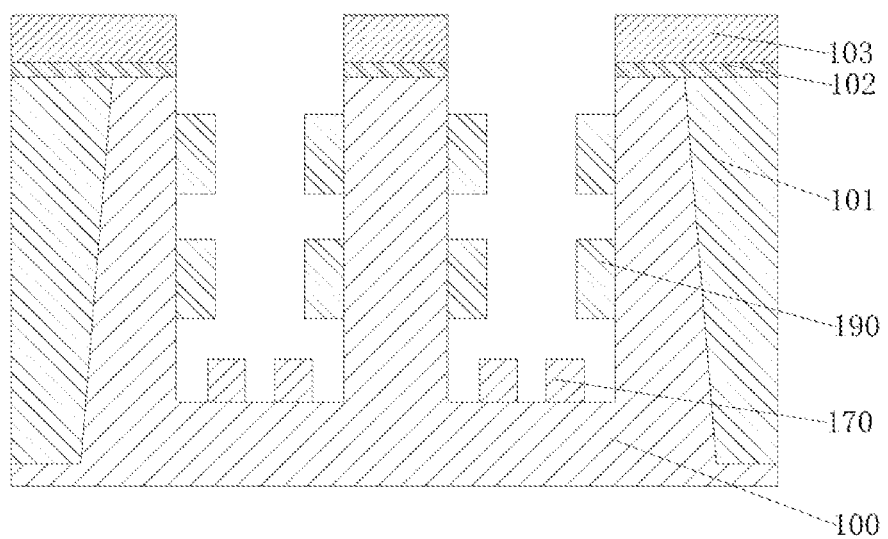

In the embodiment of the present application, a convex portion is arranged on an inner wall of the channel 105. The inner wall of the channel 105 includes a bottom wall and a sidewall. FIG. 2 and FIG. 3 show an embodiment of a semiconductor structure with a convex portion arranged on a bottom wall. Referring to FIG. 2 and FIG. 3, the convex portion may be arranged only on the bottom wall of the channel 105. Alternatively, FIG. 4 and FIG. 5 show an embodiment of a semiconductor structure with a convex portion arranged on a sidewall. Referring to FIG. 4 and FIG. 5, the convex portion may be arranged only on the sidewall of the channel 105. Alternatively, FIG. 1 and FIG. 6 show an embodiment of a semiconductor structure with convex portions arranged on a sidewall and a bottom wall. Referring to FIG. 1 and FIG. 6, the bottom wall and the sidewall of the channel 105 may be each provided with the convex portion.

In the embodiment of the present application, a number of the convex portion is not specifically limited. For example, referring to FIG. 1 and FIG. 2, the bottom wall may be provided with one convex portion. Alternatively, referring to FIG. 3 and FIG. 6, the bottom wall may also be provided with a plurality of convex portions spaced. Also, referring to FIG. 1 and FIG. 4, the sidewall may be provided with one convex portion. Alternatively, referring to FIG. 5 and FIG. 6, the sidewall may also be provided with a plurality of convex portions. When a plurality of convex portions are arranged on a wall surface (for example, the bottom wall or the sidewall) of the inner wall of the channel 105, the plurality of convex portions are spaced. The convex portions may be at an equal pitch. In some embodiments, referring to FIG. 1 to FIG. 3 and FIG. 6, the convex portion includes a first convex portion 170 arranged on the bottom wall of the channel 105, and shallow trenches are formed between the first convex portion 170 and two sidewalls of the channel 105 respectively. Under a condition that a depth of the channel 105 is constant, the first convex portion 170 arranged on the bottom wall can increase a length of the channel by two heights H2 of the first convex portion 170.

In some embodiments, referring to FIG. 3 and FIG. 6, at least two first convex portions 170 are provided. One first convex portion 170 can increase the length of the channel by two heights H2 of the first convex portion 170. Each time one first convex portion 170 is added, the length of the channel can be increased by two heights H2 of the first convex portion 170. When a plurality of first convex portions 170 are provided, the length of the channel can be increased more without increasing the depth of the channel. The at least two first convex portions 170 are spaced in a direction perpendicular to the two sidewalls of the channel. The at least two first convex portions 170 may be equally spaced. In an exemplary embodiment, a distance between a sidewall and an adjacent first convex portion 170 may be equal to that between two adjacent first convex portions 170. The at least two first convex portions 170 may be of a same size or different sizes. For example, all first convex portions 170 may specifically have a uniform height H2 and a uniform width W3. The first convex portions 170 may be formed simultaneously using a same process condition, which simplifies a manufacturing process and improves the manufacturing efficiency.

In some embodiments, referring to FIG. 1 and FIG. 4 to FIG. 6, the convex portion includes a second convex portion 190 arranged on a sidewall of the channel 105. A distance W2 (a width of the second convex portion 190) by which the second convex portion 190 protrudes from the sidewall of the channel increases the length of the channel 105. Under a condition that the depth of the channel 105 is constant, the second convex portion 190 on one side can increase the length of the channel by two W2. At least one sidewall of the channel 105 is provided with the second convex portion 190.

In some embodiments, referring to FIG. 5 and FIG. 6, at least two second convex portions 190 are provided on each sidewall. As illustrated in the figures, one second convex portion 190 can increase the length of the channel by two widths W2 of the second convex portion 190. Each time one second convex portion 190 is added, the length of the channel can be increased by two widths W2 of the second convex portion 190. When a plurality of second convex portions 190 are provided, the length of the channel can be increased more without increasing the depth of the channel. The at least two second convex portions 190 on each sidewall are spaced in a depth direction of the channel. The at least two second convex portions 190 may be equally spaced. The at least two second convex portions 190 may be of a same size or different sizes. For example, all second convex portions 190 may specifically have a uniform height H1 and a uniform width W2.

In some embodiments, two sidewalls of the channel 105 are each provided with the second convex portion 190. The two sidewalls of the channel 105 are each provided with the second convex portion 190, so as to further increase the length of the channel. The second convex portions 190 on the two sidewalls of the channel 105 are arranged opposite to each other. The second convex portions 190 on the two sidewalls are arranged opposite to each other and can remain symmetric. The second convex portions 190 may be formed simultaneously using a same process condition without additional processes, which improves the manufacturing efficiency.

In some embodiments, referring to FIG. 1, in an embodiment where the first convex portion 170 is in a rectangular cross-sectional shape, a distance by which the first convex portion 170 protrudes from the bottom wall of the channel is referred to as a height H2 of the first convex portion. The height H2 of the first convex portion may specifically range from 10 nm to 30 nm. The height H2 of the first convex portion 170 is above 10 nm, which can effectively increase the length of the channel. The height H2 of the first convex portion 170 is controlled to be below 30 nm, which can prevent the influence on other properties of the semiconductor structure. A distance of the first convex portion 170 in the direction perpendicular to the two sidewalls may be referred to as a width W3 of the first convex portion 170. The width W3 of the first convex portion 170 may specifically range from 5 nm to 10 nm.

In some embodiments, referring to FIG. 1, in an embodiment where the second convex portion 190 is in a rectangular cross-sectional shape, a distance by which the second convex portion 190 protrudes from the sidewall of the channel 105 is referred to as a width W2 of the second convex portion 190. The width W2 of the second convex portion 190 may specifically range from 2 nm to 6 nm. A dimension of the second convex portion 190 in the depth direction of the channel 105 is referred to as a height H1 of the second convex portion 190. The height H1 of the second convex portion 190 may specifically range from 20 nm to 60 nm. A distance H3 from the second convex portion 190 to the surface of the substrate 100 may specifically range from 10 nm to 60 nm.

Other parts of the semiconductor structure not mentioned in the embodiment of the present application may use the prior art and are not described in detail herein. For example, in some embodiments, the semiconductor structure further includes a gate structure. Specifically, the gate structure may include a gate dielectric layer arranged on an inner wall surface of the channel and a gate electrode layer arranged on the gate dielectric layer. A surface of the gate dielectric layer may also be covered with an insulating layer.

Figure 26:
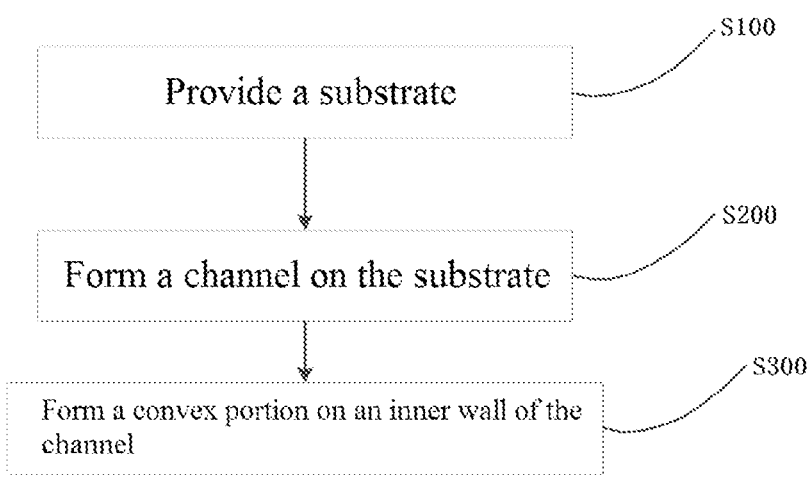
FIG. 26 is a schematic flowchart of a semiconductor structure formation method according to an embodiment of the present application.

An embodiment of the present application provides a semiconductor structure formation method. The semiconductor structure described in any one of the above embodiments can be obtained with the method. The following embodiment of the method may be used to understand the semiconductor structure, and the embodiment of the semiconductor structure may also be used to understand the following semiconductor structure formation method. FIG. 26 is a flowchart of an embodiment of a semiconductor structure formation method according to the present application. Referring to FIG. 26, the formation method includes the following steps.

In S100, a substrate is provided.

In S200, a channel is formed on the substrate.

In S300, a convex portion is formed on an inner wall of the channel.

In the semiconductor structure formation method according to the embodiment of the present application, the convex portion is formed on the inner wall of the channel configured to form a buried gate structure. Under a condition that a depth of the channel is constant, the convex portion can increase a length of the channel, which meets a development direction of a small size, and solve the short-channel effect, so as to solve the problem of reduction of the threshold voltage caused by the short-channel effect, and further improve the stability and electrical performance of the device.

FIG. 7 to FIG. 21 are schematic diagrams of cross-sectional structures at various stages during the formation of a semiconductor structure according to an embodiment of the present application. The semiconductor structure formation method according to the embodiment of the present application is further described below with reference to FIG. 1 to FIG. 21.

Figure 7:
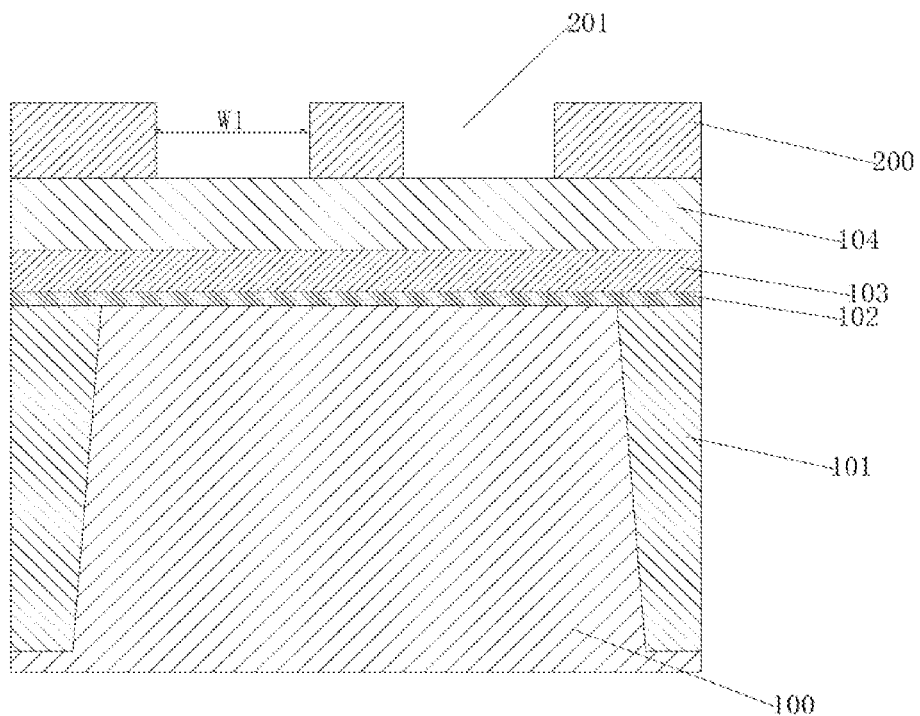
FIG. 7 to FIG. 25 are schematic diagrams of cross-sectional structures at various stages during the formation of a semiconductor structure according to an embodiment of the present application.

Referring to FIG. 7, an isolation region 101 is formed on the substrate 100 provided in step S100 shown in FIG. 7, the surface of the substrate 100 is sequentially provided with an oxide layer 102, a SIN layer 103 and a second sacrificial layer 104, and the second sacrificial layer is provided with a photoresist layer 200.

Figure 8:
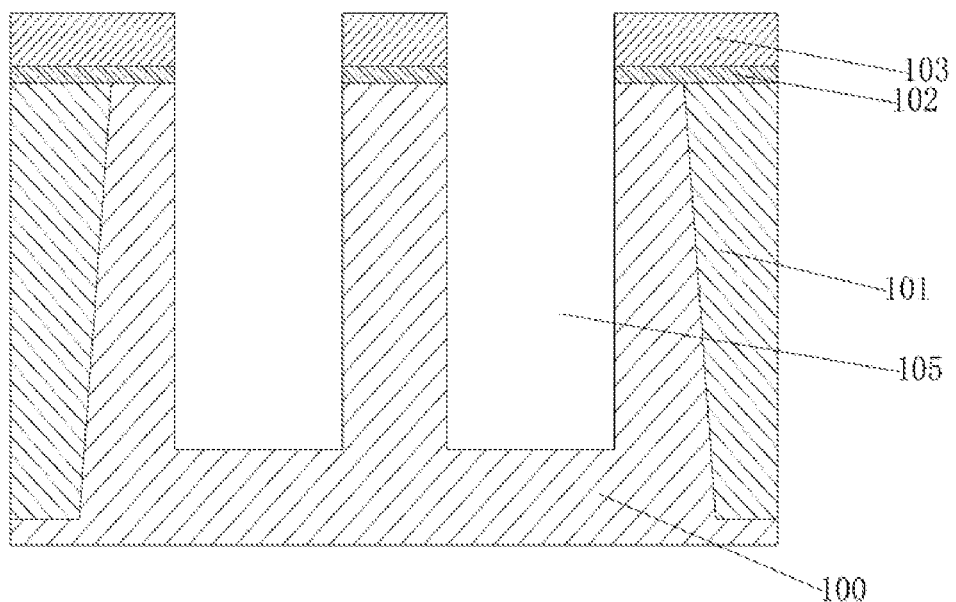

During a specific implementation of step S200 in which a channel is formed on the substrate, a pattern 201 is defined on the silicon substrate 100, the silicon substrate is etched by using the photoresist layer 200, the second sacrificial layer 104, the SIN layer 103 and the oxide layer 102 as an etch barrier layer, the excessive etch barrier layer is removed to form the channel 105 on the substrate, and a structure shown in FIG. 8 is obtained. The pattern 201 defined by the structure may be directly defined by lighting, or the pattern may be defined first by lighting and then by pitch double, which may be determined by a width W1 of a buried gate during specific implementation. The width W1 of the buried gate may specifically range from 5 nm to 80 nm.

A thickness of the etch barrier layer may be between 20 nm and 250 nm. In theory, the etch barrier layer may be made of any material with a selectivity ratio meeting a requirement, which is not described in detail herein.

In some embodiments, step S300 of forming a convex portion on an inner wall of the channel includes the following step.

In S310, a first convex portion 170 is formed on a bottom wall of the channel, and shallow trenches are formed between the first convex portion 170 and two sidewalls of the channel respectively.

Referring to FIG. 9 to FIG. 13, in a specific implementation, S310 of forming a first convex portion 170 on a bottom wall of the channel includes the following steps.

Figure 9:
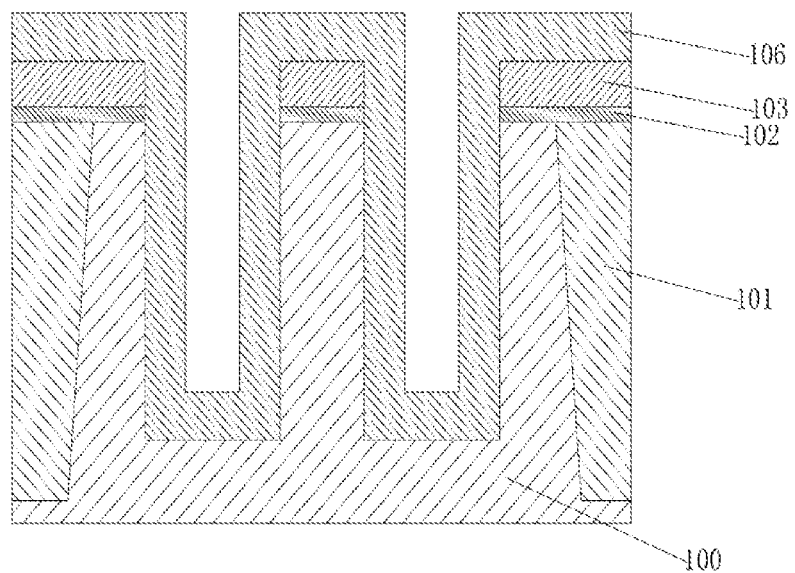

In S311, a first sacrificial layer 106 is formed on the inner wall of the channel; the first sacrificial layer 106 covers a sidewall and the bottom wall of the channel 105; and a structure obtained is shown in FIG. 9.

Figure 10:
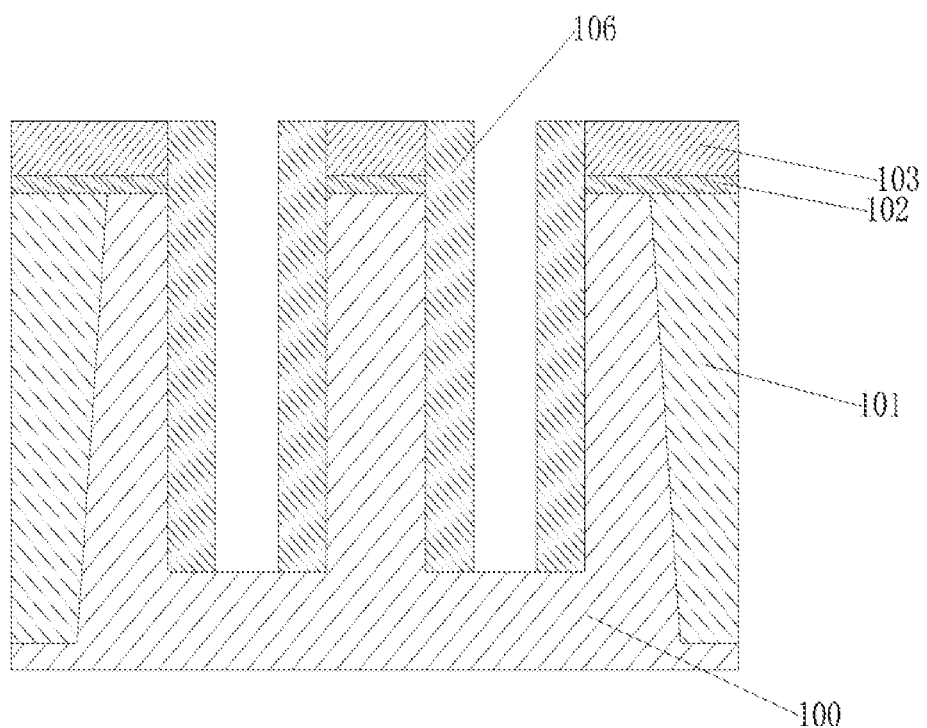

In S312, the first sacrificial layer 106 at the bottom is removed to expose the bottom wall of the channel. In a specific implementation, the first sacrificial layer 106 may be etched back to remove the first sacrificial layer 106 at the bottom, the first sacrificial layer 106 on the sidewall is retained, and a structure obtained is shown in FIG. 10. Referring to FIG. 10, in the specific implementation, when the first sacrificial layer 106 is etched back, the first sacrificial layer at the bottom is completely removed along the first sacrificial layer 106 on two sidewalls to expose the bottom wall of the channel 105.

Figure 11:
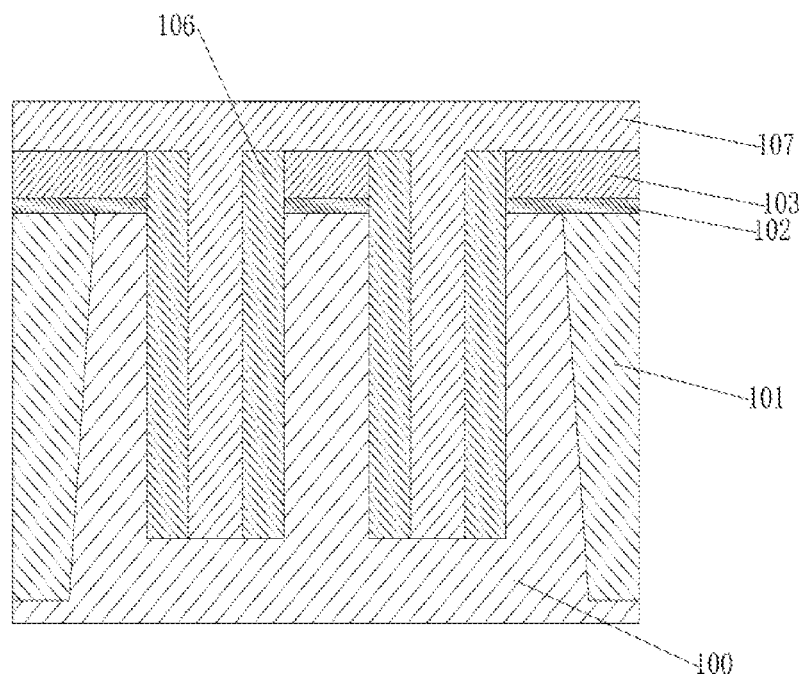

In S313, a first extension layer 107 is formed on the exposed bottom wall. In a specific implementation, the first extension layer 107 may be formed between the first sacrificial layers 106 from the exposed bottom wall by epitaxial growth, and a structure obtained is shown in FIG. 11.

Figure 12:
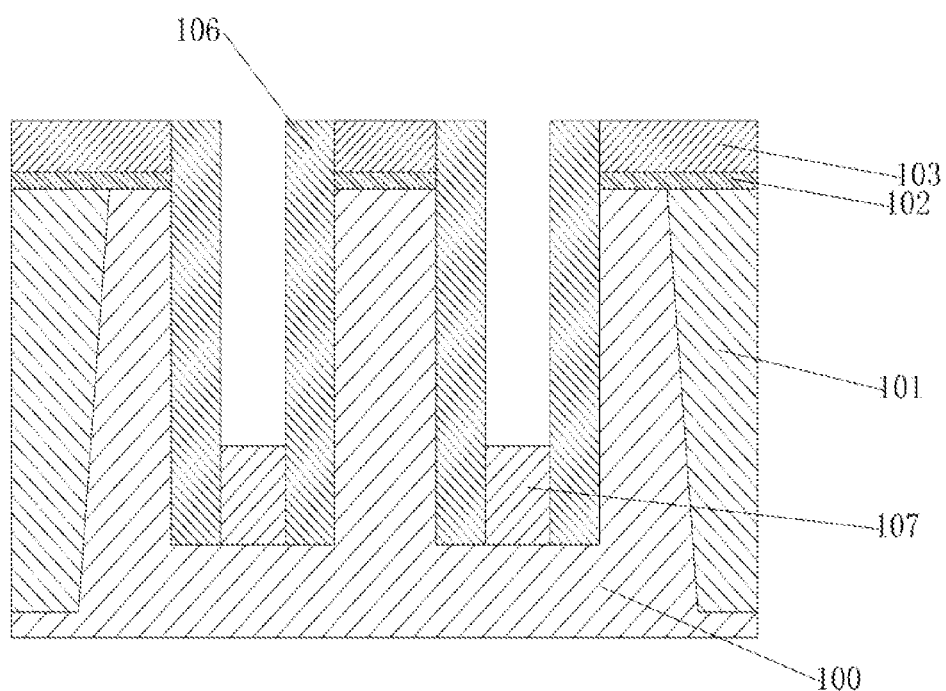

In S314, part of the first extension layer 107 is removed to enable the remaining first extension layer 107 to protrude from the bottom wall of the channel by a first height. In a specific implementation, the first extension layer 107 deposited between the first sacrificial layers 106 is etched back to remove an upper part of the first extension layer 107. An etch-back depth is related to an etch time. A height of the remaining first extension layer 107 is a design height H2 by controlling the etch time, and a structure obtained is shown in FIG. 12.

In S315, the first sacrificial layer 106 is removed; that is, the first convex portion 170 is formed on the bottom wall of the channel 105. In a specific implementation, the first sacrificial layer 106 may be removed by wet removal or dry removal, and a structure obtained is shown in FIG. 13.

In addition to the manner described in S311 to S312, other suitable manners may also be adopted to form the first sacrificial layer 106 on the sidewall of the channel 105 and expose the bottom wall of the channel 105. Then, S313 is implemented to form the first extension layer 107 on the bottom wall of the channel 105 exposed between the first sacrificial layers 106 formed on the sidewall.

Figure 13:
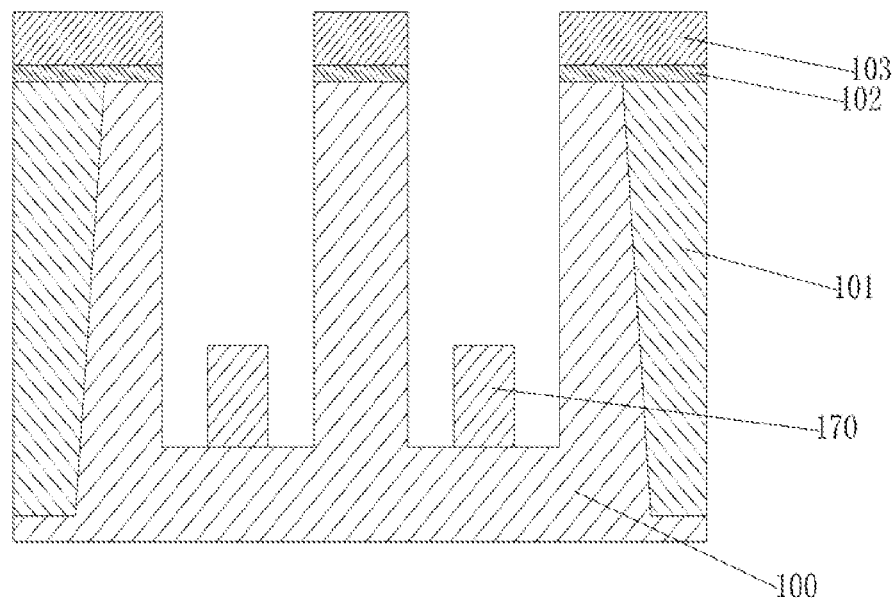

In the embodiment of the semiconductor structure shown in FIG. 13, only one first convex portion 170 is formed on the bottom wall. In other embodiments, a plurality of first convex portions 170 may be formed on the bottom wall. A specific manner of forming a plurality of first convex portions 170 on the bottom wall may be illustrated through the following embodiment.

Figure 19:
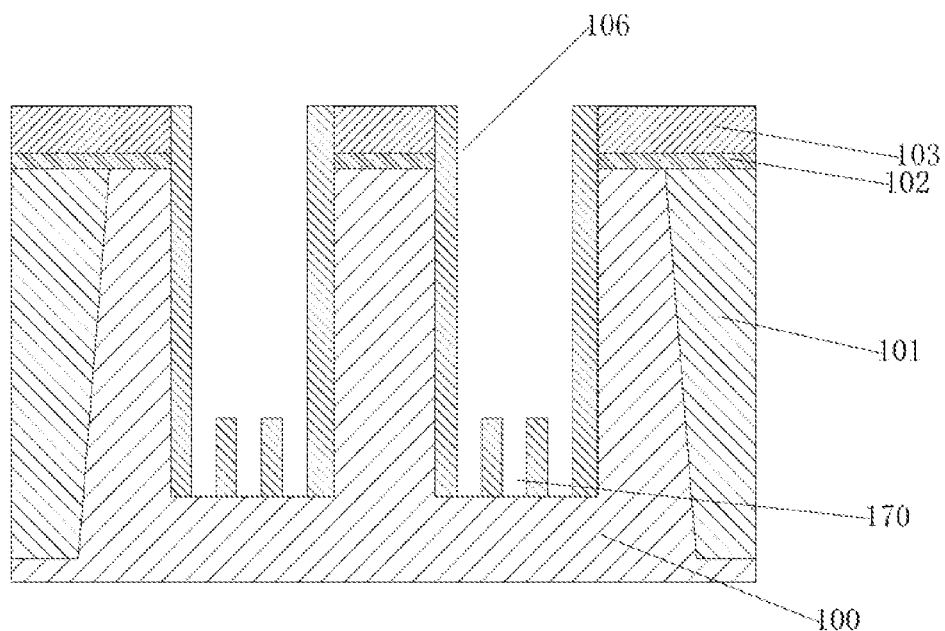

In another specific implementation, referring to FIG. 19, FIG. 19 is a schematic structural diagram obtained according to another embodiment in which the first sacrificial layer 106 at the bottom is removed. The step of removing the first sacrificial layer 106 at the bottom to expose the bottom wall of the channel 105 includes:

removing the first sacrificial layer 106 at the bottom at intervals to enable the first sacrificial layer 106 to form, at intervals in a direction perpendicular to two sidewalls of the channel 105, at least two notches exposing the bottom wall of the channel 105. In a specific implementation, the first sacrificial layer 106 may be etched back to remove the first sacrificial layer 106 at the bottom at intervals to form the at least two notches exposing the bottom wall of the channel 105. A structure obtained is shown in FIG. 19.

The semiconductor structure with at least two first convex portions 170 formed on the bottom wall of the channel 105 may be obtained by continuing other steps of forming the first convex portion 170 on the basis of the structures obtained in the above embodiments.

In an exemplary embodiment, the step of forming at least two first convex portions 170 on the bottom wall of the channel 105 includes the following steps.

In S321, a first sacrificial layer 106 is formed on the inner wall of the channel; the first sacrificial layer 106 covers a sidewall and the bottom wall of the channel 105; and a structure obtained is shown in FIG. 9.

In S322, the first sacrificial layer 106 at the bottom is removed at intervals to enable the first sacrificial layer 106 to form, at intervals in a direction perpendicular to two sidewalls of the channel 105, at least two notches exposing the bottom wall of the channel 105. In a specific implementation, the first sacrificial layer 106 may be etched back to form the at least two notches exposing the bottom wall of the channel 105. A structure obtained is shown in FIG. 19.

Figure 20:
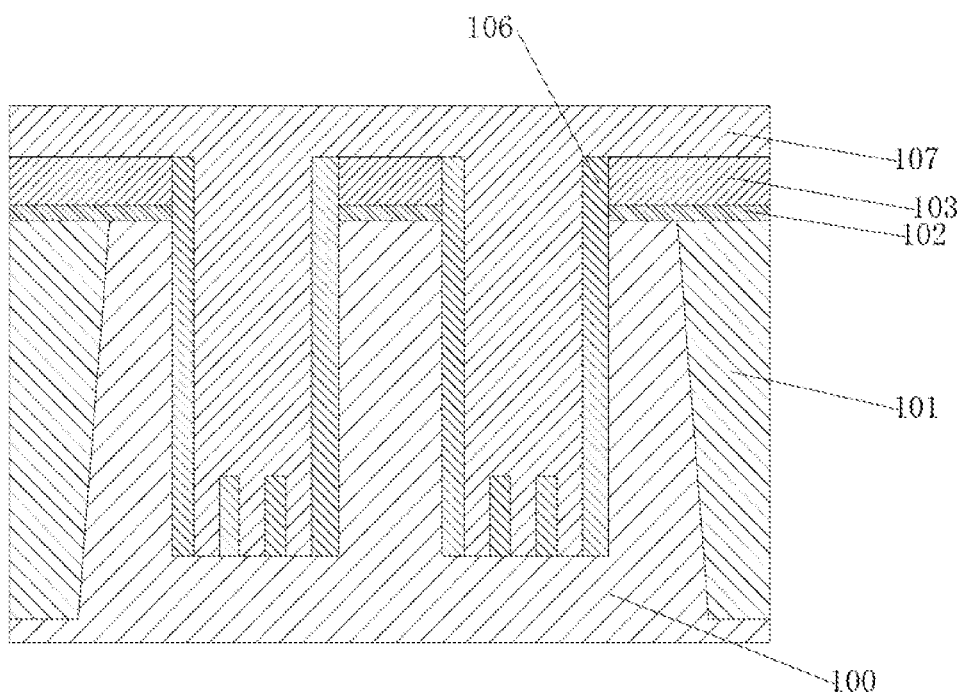

In S323, a first extension layer 107 is formed on the exposed bottom wall. In a specific implementation, the first extension layer 107 may be formed between the first sacrificial layers 106 from the exposed bottom wall by epitaxial growth. The first extension layer 107 fills the notch exposing the bottom wall. A height of the first extension layer 107 is generally greater than a design height of the first convex portion 170. For example, a structure obtained is shown in FIG. 20.

Figure 21:
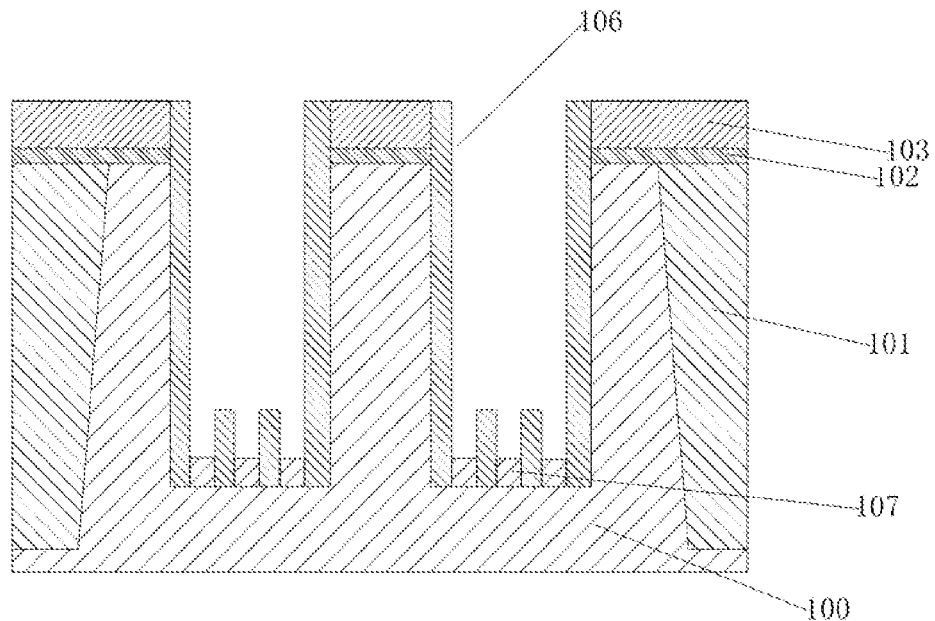

In S324, part of the first extension layer 107 is removed to enable the remaining first extension layer 107 to protrude from the bottom wall of the channel 105 by a first height (i.e., the design height of the first convex portion 170). In a specific implementation, the first extension layer 107 is etched back to remove an upper part of the first extension layer 107. An etch-back depth is related to an etch time. A height of the remaining first extension layer 107 is a design height H2 by controlling the etch time, and a structure obtained is shown in FIG. 21.

In S325, the first sacrificial layer 106 is removed, so that the first convex portion 170 is formed on the bottom wall of the channel 105. In a specific implementation, the first sacrificial layer 106 may be removed by wet removal or dry removal, and a structure obtained is shown in FIG. 3.

In another specific implementation, the step of forming at least two first convex portions 170 on the bottom wall may also involve etching back the first extension layer 107 by using an appropriate pattern so as to form a plurality of first convex portions 170 on the bottom wall in step S314 of removing part of the first extension layer 107.

Alternatively, in another specific implementation, all or some steps of S311 to S315 may also be repeated to form one first convex portion 170 at a time, so as to form at least two first convex portions 170 on the bottom wall.

The first convex portion 170 may be formed on the bottom wall of the channel 105 through the above process. Related processes of forming a gate structure may be performed subsequently. Alternatively, a process of forming a convex portion on the sidewall is further performed to form convex portions on the bottom wall and the sidewall of the channel 105 respectively.

In some embodiments, the step of forming a convex portion on an inner wall of the channel 105 includes: forming a second convex portion 190 on at least one sidewall of the channel 105.

In an exemplary embodiment, the step of forming a second convex portion 190 on the sidewall of the channel 105 may be directly forming the second convex portion 190 after the channel is formed. In the specific implementation, the second convex portion 190 may be formed only on the sidewall of the channel 105.

In another exemplary embodiment, the second convex portion 190 may also be formed on the sidewall after the first convex portion 170 is formed on the bottom wall. In the specific implementation, convex portions may be formed on the sidewall and the bottom wall of the channel 105 respectively.

In a specific implementation, the second convex portion 190 is formed after the first convex portion 170 is formed. Specifically, after the step of forming a first convex portion 170 on a bottom wall of the channel 105, the method further includes the following steps.

In S316, a second sacrificial layer 108 of a second height is formed at a bottom of the channel 105, the second height being greater than the first height. The second sacrificial layer 108 covers the first convex portion 170 formed on the bottom wall, so that the first convex portion 170 is not affected in subsequent steps. One or at least two first convex portions 170 may be formed on the bottom wall.

Figure 14:
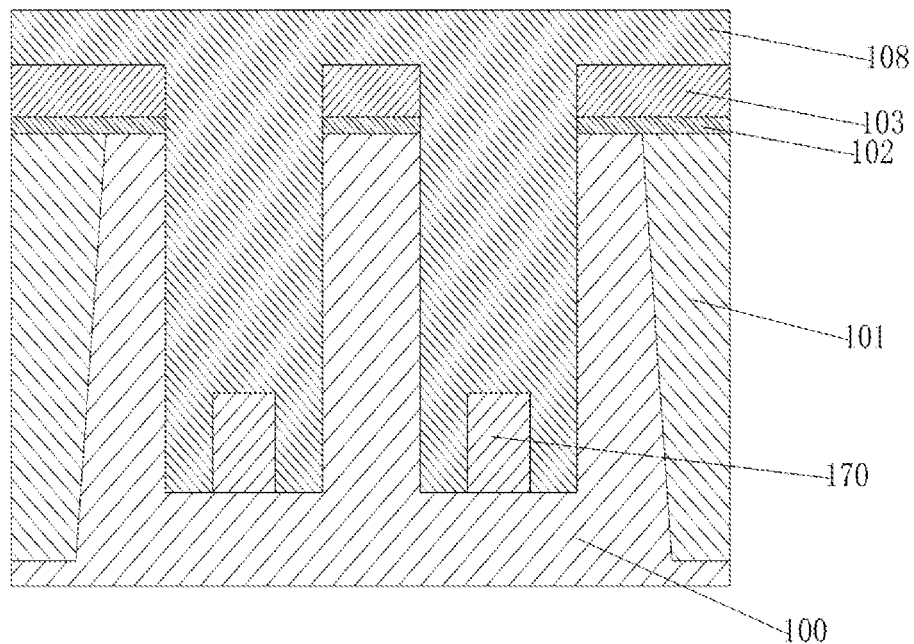
Figure 15:
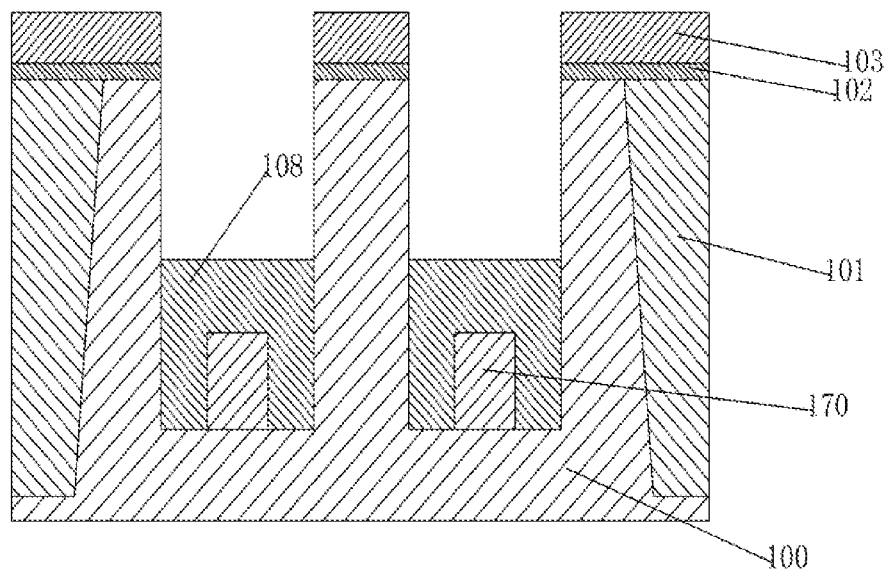

In an exemplary embodiment, S316 of forming a second sacrificial layer 108 of a second height may include: S3161: depositing the second sacrificial layer 108 in the channel. In an example where the second sacrificial layer 108 is formed on the basis of the structure obtained in S315, a structure obtained is shown in FIG. 14. In S3162, part of the second sacrificial layer 108 is removed to enable a height of the remaining second sacrificial layer 108 to be a second height. For example, the deposited second sacrificial layer 108 is etched back, an etch-back depth may be controlled through an etch time, so that the height of the remaining second sacrificial layer 108 is the second height, the second sacrificial layer 108 covers the first convex portion 170, and a structure obtained is shown in FIG. 15. The second height is a distance from the second convex portion 190 to the bottom wall of the channel.

Figure 16:
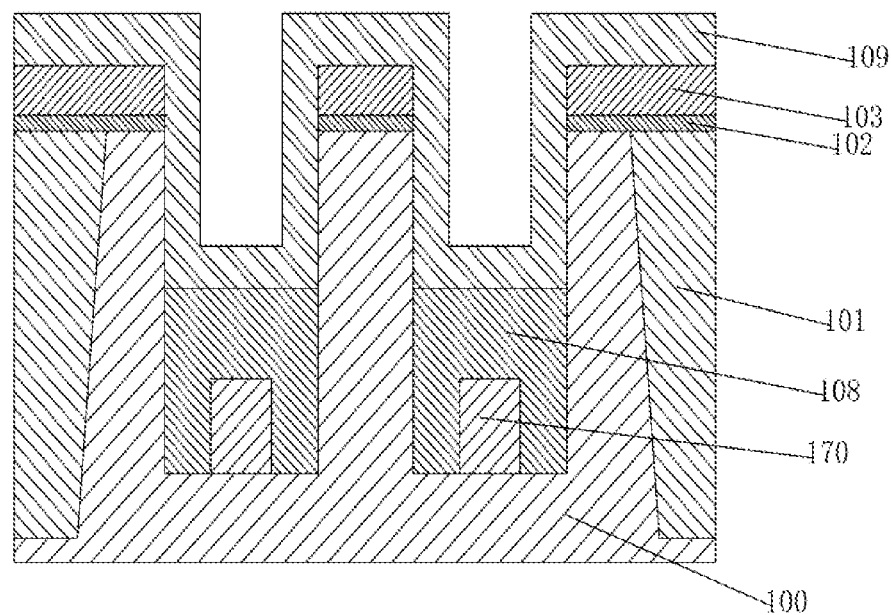

In S317, a second extension layer 109 is formed on the inner wall of the channel 105 on which the second sacrificial layer 108 is formed. Specifically, the second extension layer 109 is deposited on the sidewall of the channel 105 and a surface of the second sacrificial layer 108 at the bottom, and a structure obtained is shown in FIG. 16.

Figure 17:
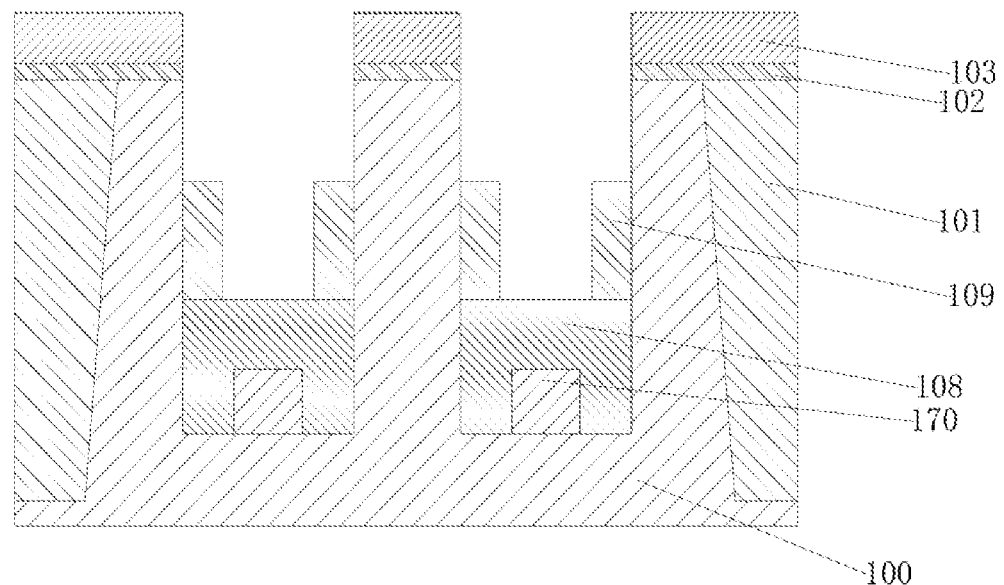

In S318, the second extension layer 109 at the bottom is removed to expose the second sacrificial layer 108 and part of the second extension layer 109 on the sidewall is removed, so as to enable a dimension of the second extension layer 109 remaining on the sidewall of the channel 105 along a depth direction of the channel to reach a design dimension (H1). Specifically, the deposited second extension layer 109 is etched back, an etch-back depth of the second extension layer 109 on the sidewall may be controlled through an etch time, and a structure obtained is shown in FIG. 17.

Alternatively, the second extension layer 109 is formed on the sidewall of the channel 105 by epitaxial growth. Then, part of the second extension layer 109 on the sidewall is removed, so as to enable a dimension of the second extension layer 109 remaining on the sidewall of the channel 105 along a depth direction of the channel to reach a design dimension (H1).

Figure 18:
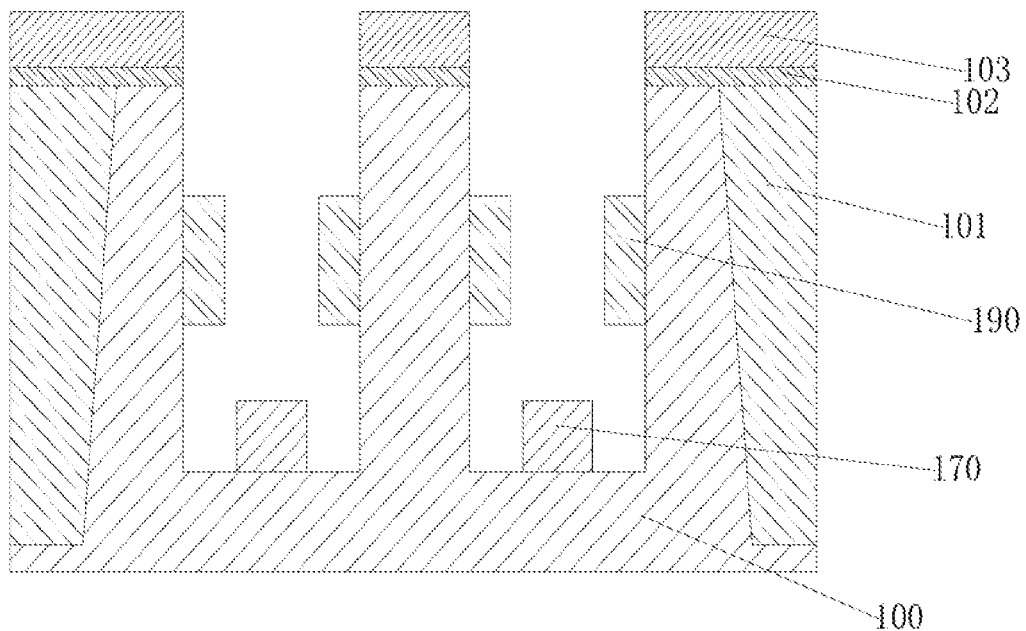

In S319, the second sacrificial layer 108 is removed, so that the second convex portion 190 can be formed on the sidewall of the channel 105. Specifically, the second sacrificial layer 108 may be removed by dry removal, and a structure obtained is shown in FIG. 18.

In the above embodiment, one second convex portion 190 is formed on the sidewall of the channel 105. At least two second convex portions 190 may be formed on the sidewall of the channel 105 by repeating some steps including S317 and S318.

In a specific implementation, the step of forming at least two second convex portions 190 on the sidewall of the channel 105 includes the following step.

In S336, a second sacrificial layer 108 of a second height is formed at a bottom of the channel 105, the second height being greater than the first height. The second sacrificial layer 108 covers the first convex portion 170 formed on the bottom wall, so that the first convex portion 170 is not affected in subsequent steps. One or at least two first convex portions 170 may be formed on the bottom wall.

Details of S331 may be obtained with reference to S316. For example, the step of forming a second sacrificial layer 108 of a second height may include: depositing the second sacrificial layer 108 in the channel. In an example where the second sacrificial layer 108 is formed on the basis of the structure obtained in S315, a structure obtained is shown in FIG. 14. Part of the second sacrificial layer 108 is removed to enable a height of the remaining second sacrificial layer 108 to be a second height. For example, the deposited second sacrificial layer 108 is etched back, an etch-back depth may be controlled through an etch time, so that the height of the remaining second sacrificial layer 108 is the second height, the second sacrificial layer 108 covers the first convex portion 170, and a structure obtained is shown in FIG. 15. The second height is a distance from the second convex portion 190 to the bottom wall of the channel.

In S332, the second extension layer 109 is formed on the inner wall of the channel 105 on which the second sacrificial layer 108 is formed. Specifically, referring to S317, the second extension layer 109 is deposited on the sidewall of the channel 105 and the surface of the second sacrificial layer 108 at the bottom, and the structure obtained is shown in FIG. 16.

In S333, the second extension layer 109 at the bottom is removed to expose the second sacrificial layer 108 and part of the second extension layer 109 on the sidewall is removed, so as to enable a dimension of the second extension layer 109 remaining on the sidewall of the channel 105 along a depth direction of the channel to reach a design dimension (H1). Specifically, referring to S318, the deposited second extension layer 109 is etched back, the etch-back depth of the second extension layer 109 on the sidewall may be controlled through the etch time, and the structure obtained is shown in FIG. 17.

Figure 22:
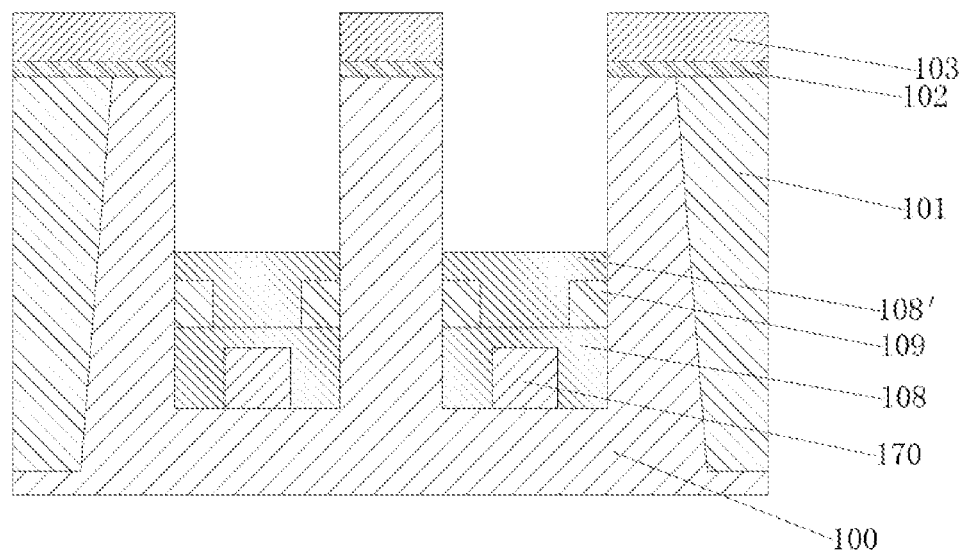

In S334, a third sacrificial layer 108a is formed on the second sacrificial layer 108 in the channel 105 to enable the third sacrificial layer 108a filling the channel 105 to cover the remaining second extension layer 109. A specific method for forming the third sacrificial layer 108a may be obtained with reference to S316, and is not described in detail herein. A structure obtained is shown in FIG. 22.

Figure 23:
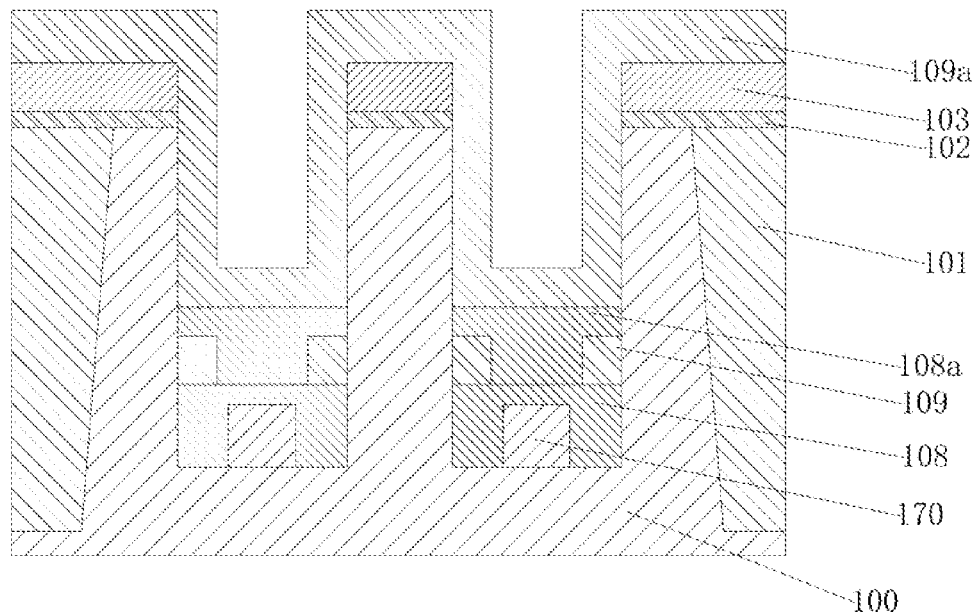

In S335, a third extension layer 109a is formed on the inner wall of the channel 105. A specific method for forming the third extension layer 109a may be obtained with reference to S317, and is not described in detail herein. A structure obtained is shown in FIG. 23.

Figure 24:
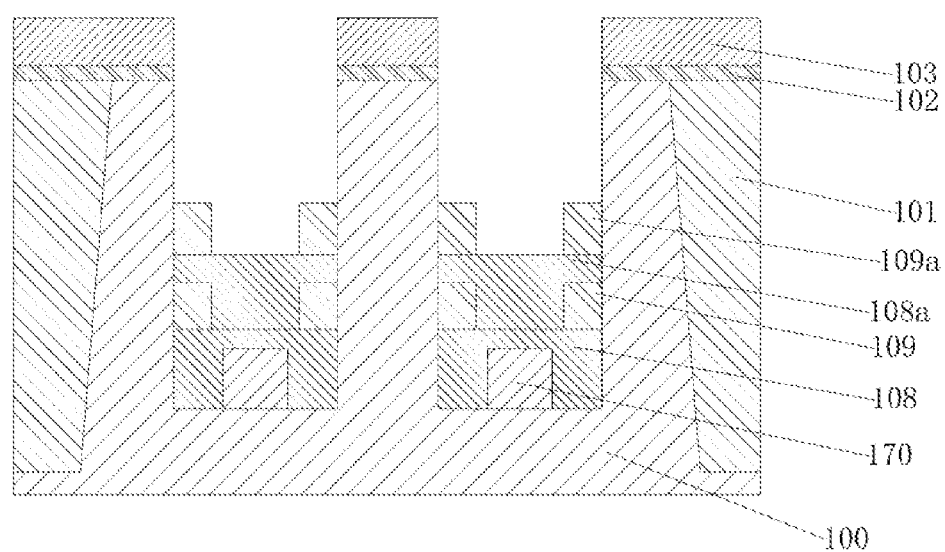

In S336, the third extension layer 109a at the bottom is removed to expose the third sacrificial layer 108a and part of the third extension layer 109a on the sidewall is removed, so as to enable a dimension of the third extension layer remaining on the sidewall of the channel along a depth direction of the channel to reach a design dimension. A specific method for removing part of the third extension layer 109a at the bottom and on the sidewall in S336 may be obtained with reference to S318, and is not described in detail herein. A structure obtained is shown in FIG. 24.

Figure 25:
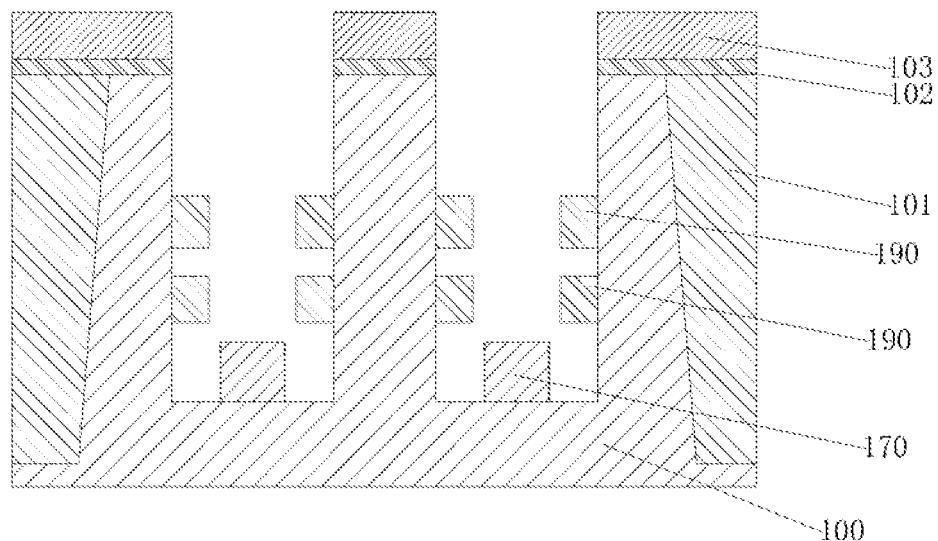

In S337, the third sacrificial layer 108a and the second sacrificial layer 108 are removed. Details may be obtained with reference to S319, and a structure obtained is shown in FIG. 25.

In the above embodiment, a plurality of second convex portions 190 may be formed on the sidewall of the channel 105 by repeating the step of forming a single second convex portion 190.

In an exemplary embodiment, the second convex portion 190 is formed after the channel 105 is formed, and a semiconductor structure with the second convex portion 190 formed only on the sidewall of the channel 105 can be obtained. The manner of forming the second convex portion 190 may be obtained with reference to S316 to S319 in the previous embodiment. Specifically, after the step of forming a channel 105 on the substrate 100, the step of forming a second convex portion 190 on at least one sidewall of the channel 105 includes the following steps.

In S346, a second sacrificial layer 108 of a third height is formed at a bottom of the channel 105. Specifically, the second sacrificial layer 108 may be deposited in the channel 105 at first. The deposited second sacrificial layer 108 is etched back, and an etch-back depth may be controlled through an etch time, so that the height of the remaining second sacrificial layer 108 is the second height. The second height is a distance from the second convex portion 190 to the bottom wall of the channel. A specific step may be obtained with reference to S316, and is not described in detail herein.

In S347, a second extension layer is formed on the inner wall of the channel 105 on which the second sacrificial layer 108 is formed. Specifically, referring to S317, the second extension layer 109 is deposited on the sidewall of the channel 105 and the surface of the second sacrificial layer 108 at the bottom.

In S348, the second extension layer 109 at the bottom is removed to expose the second sacrificial layer 108 and part of the second extension layer 109 on the sidewall is removed, so as to enable a dimension of the second extension layer 109 remaining on the sidewall of the channel 105 along a depth direction of the channel to reach a design dimension (H1). Specifically, referring to S318, the deposited second extension layer 109 is etched back, and the etch-back depth of the second extension layer 109 on the sidewall may be controlled through the etch time.

In S349, the second sacrificial layer is removed, so that the second convex portion 190 can be formed on the sidewall of the channel 105. Specifically, the second sacrificial layer 108 may be removed by dry removal.

A specific method for forming at least two second convex portions 190 only on the sidewall of the channel 105 may be obtained with reference to steps S331 to S337 in the above embodiment. In a specific implementation, the step of forming at least two second convex portions 190 on the sidewall of the channel 105 includes the following step.

A second sacrificial layer of a third height is formed at a bottom of the channel. Details may be obtained with reference to S331 and are not described herein.

A second extension layer is formed on the inner wall of the channel on which the second sacrificial layer is formed. Details may be obtained with reference to S332 and are not described herein.

The second extension layer at the bottom is removed to expose the second sacrificial layer and part of the second extension layer on the sidewall is removed, so as to enable a dimension of the second extension layer remaining on the sidewall of the channel along a depth direction of the channel to reach a design dimension. Details may be obtained with reference to S333 and are not described herein.

A third sacrificial layer is formed in the channel to enable the third sacrificial layer filling the channel to cover the remaining second extension layer. Details may be obtained with reference to S334 and are not described herein.

A third extension layer is formed on the inner wall of the channel. Details may be obtained with reference to S335 and are not described herein.

The third extension layer at the bottom is removed to expose the third sacrificial layer and part of the third extension layer on the sidewall is removed, so as to enable a dimension of the third extension layer remaining on the sidewall of the channel along a depth direction of the channel to reach a design dimension. Details may be obtained with reference to S336 and are not described herein.

The third sacrificial layer and the second sacrificial layer are removed. Details may be obtained with reference to S337 and are not described herein.

In the embodiment of the present application, materials of the sacrificial layers (including the first sacrificial layer, the second sacrificial layer and the third sacrificial layer) are not limited, which may be an oxide layer, a nitride layer, a carbon layer, etc. Materials and formation manners of the extension layers (including the first extension layer, the second extension layer and the third extension layer) are not limited. The extension layer may be formed by epitaxial growth or deposition. Specifically, molecular beam epitaxial growth or atomic layer deposition may be adopted.

In a third aspect, an embodiment of the present application provides a memory, including the semiconductor structure described in any one of the above embodiments.

The above descriptions are merely exemplary embodiments of the present disclosure, but are not to limit the scope of the present disclosure. That is, equivalent changes and modifications made according to the teaching of the present disclosure shall still fall within the scope of the present disclosure. After considering the specification and practicing the disclosure herein, those skilled in the art would easily conceive of other implementations of the present disclosure. The present application is intended to cover any variations, uses, or adaptive changes of the present disclosure. These variations, uses, or adaptive changes follow the general principles of the present disclosure and include common knowledge or common technical means in the art that are not disclosed in the present disclosure. The specification and the embodiments are considered as merely exemplary, and the scope and spirit of the present disclosure are defined by the claims.

What is claimed is:

1. A semiconductor structure, comprising:
   a substrate;
   a channel located in the substrate, the channel being configured to form a gate structure; and
   a convex portion arranged on an inner wall of the channel;
   wherein the convex portion comprises a first convex portion arranged on a bottom wall of the channel, and shallow trenches are formed between the first convex portion and two sidewalls of the channel respectively.

2. The semiconductor structure according to claim 1, wherein at least two first convex portions are provided, and the at least two first convex portions are spaced in a direction perpendicular to the two sidewalls of the channel.

3. The semiconductor structure according to claim 1, wherein the convex portion comprises a second convex portion arranged on a sidewall of the channel, and at least one sidewall of the channel is provided with the second convex portion.

4. The semiconductor structure according to claim 3, wherein at least two second convex portions are provided on each sidewall, and the at least two second convex portions on each sidewall are spaced in a depth direction of the channel.

5. The semiconductor structure according to claim 3, wherein two sidewalls of the channel are each provided with the second convex portion, and the second convex portions on the two sidewalls of the channel are arranged opposite to each other.

6. The semiconductor structure according to claim 3, wherein the second convex portion protrudes from the sidewall of the channel by 2 nm to 6 nm; the second convex portion has a dimension ranging from 20 nm to 60 nm in a depth direction of the channel; and the second convex portion is at a distance of 10 nm to 60 nm from a surface of the substrate.

7. The semiconductor structure according to claim 1, wherein the first convex portion protrudes from the bottom wall of the channel by 10 nm to 30 nm, and the first convex portion has a width ranging from 5 nm to 10 nm.

8. A memory, comprising the semiconductor structure according to claim 1.

9. A semiconductor structure formation method, comprising:
providing a substrate;
forming a channel on the substrate; and
forming a convex portion on an inner wall of the channel;
wherein the step of forming a convex portion on an inner wall of the channel comprises:
forming a first convex portion on a bottom wall of the channel, and forming shallow trenches between the first convex portion and two sidewalls of the channel respectively.

10. The method according to claim 9, wherein the step of forming a convex portion on an inner wall of the channel comprises:
forming a second convex portion on at least one sidewall of the channel.

11. The method according to claim 10, wherein the step of forming a second convex portion on at least one sidewall of the channel comprises:
forming a second sacrificial layer of a third height at a bottom of the channel;
forming a second extension layer on the inner wall of the channel on which the second sacrificial layer is formed;
removing the second extension layer at the bottom to expose the second sacrificial layer and removing part of the second extension layer on the sidewall, so as to enable a dimension of the second extension layer remaining on the sidewall of the channel along a depth direction of the channel to reach a design dimension; and
removing the second sacrificial layer.

12. The method according to claim 10, wherein the step of forming a second convex portion on at least one sidewall of the channel comprises:
forming a second sacrificial layer of a third height at a bottom of the channel;
forming a second extension layer on the inner wall of the channel on which the second sacrificial layer is formed;
removing the second extension layer at the bottom to expose the second sacrificial layer and removing part of the second extension layer on the sidewall, so as to enable a dimension of the second extension layer remaining on the sidewall of the channel along a depth direction of the channel to reach a design dimension;
forming a third sacrificial layer in the channel to enable the third sacrificial layer filling the channel to cover the remaining second extension layer;
forming a third extension layer on the inner wall of the channel;
removing the third extension layer at the bottom to expose the third sacrificial layer and removing part of the third extension layer on the sidewall, so as to enable a dimension of the third extension layer remaining on the sidewall of the channel along a depth direction of the channel to reach a design dimension; and
removing the third sacrificial layer and the second sacrificial layer.

13. The method according to claim 9, wherein the step of forming a first convex portion on a bottom wall of the channel comprises:
forming a first sacrificial layer on the inner wall of the channel;
removing the first sacrificial layer at the bottom to expose the bottom wall of the channel;
forming a first extension layer on the exposed bottom wall;
removing part of the first extension layer to enable the remaining first extension layer to protrude from the bottom wall of the channel by a first height; and
removing the first sacrificial layer.

14. The method according to claim 13, wherein the step of removing the first sacrificial layer at the bottom to expose the bottom wall of the channel comprises:
removing the first sacrificial layer at the bottom at intervals to enable the first sacrificial layer to form, at intervals in a direction perpendicular to two sidewalls of the channel, at least two notches exposing the bottom wall of the channel.

15. The method according to claim 13, after the step of forming a first convex portion on a bottom wall of the channel, further comprising:
forming a second sacrificial layer of a second height at a bottom of the channel, the second height being greater than the first height;
forming a second extension layer on the inner wall of the channel on which the second sacrificial layer is formed;
removing the second extension layer at the bottom to expose the second sacrificial layer and removing part of the second extension layer on the sidewall, so as to enable a dimension of the second extension layer remaining on the sidewall of the channel along a depth direction of the channel to reach a design dimension; and
removing the second sacrificial layer.

16. The method according to claim 13, after the step of forming a first convex portion on a bottom wall of the channel, further comprising:
forming a second sacrificial layer of a second height at a bottom of the channel, the second height being greater than the first height;
forming a second extension layer on the inner wall of the channel on which the second sacrificial layer is formed;
removing the second extension layer at the bottom to expose the second sacrificial layer and removing part of the second extension layer on the sidewall, so as to enable a dimension of the second extension layer remaining on the sidewall of the channel along a depth direction of the channel to reach a design dimension;
forming a third sacrificial layer on the second sacrificial layer in the channel to enable the third sacrificial layer filling the channel to cover the remaining second extension layer;
forming a third extension layer on the inner wall of the channel;
removing the third extension layer at the bottom to expose the third sacrificial layer and removing part of the third extension layer on the sidewall, so as to enable a dimension of the third extension layer remaining on the sidewall of the channel along a depth direction of the channel to reach a design dimension; and
removing the third sacrificial layer and the second sacrificial layer.

* * * * *